US011859499B2

United States Patent
Wilson et al.

(10) Patent No.: US 11,859,499 B2
(45) Date of Patent: Jan. 2, 2024

(54) TURBINE CLEARANCE CONTROL COATINGS AND METHOD

(71) Applicant: Oerlikon Surface Solutions AG, Pfäffikon, Pfäffikon (CH)

(72) Inventors: Scott Wilson, Zurich (CH); Canet Acikgoz Dorokin, Zurich (CH); Florian Rovere, Warwick, RI (US); Olivier Jarry, Cologne (DE); Montia Nestler, Ridgefield, NJ (US)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 1075 days.

(21) Appl. No.: 15/774,969

(22) PCT Filed: Nov. 9, 2016

(86) PCT No.: PCT/EP2016/001854
§ 371 (c)(1),
(2) Date: May 9, 2018

(87) PCT Pub. No.: WO2017/080645
PCT Pub. Date: May 18, 2017

(65) Prior Publication Data
US 2018/0347390 A1 Dec. 6, 2018

Related U.S. Application Data

(60) Provisional application No. 62/253,194, filed on Nov. 10, 2015.

(30) Foreign Application Priority Data

May 1, 2016 (EP) ..................................... 16000977

(51) Int. Cl.
*F01D 11/12* (2006.01)
*F01D 5/28* (2006.01)
(Continued)

(52) U.S. Cl.
CPC ............ *F01D 11/122* (2013.01); *C23C 14/04* (2013.01); *C23C 14/06* (2013.01);
(Continued)

(58) Field of Classification Search
CPC ........ F01D 11/122; F01D 11/08; F01D 11/12; F01D 5/288; F01D 5/28; F01D 5/286;
(Continued)

(56) References Cited

U.S. PATENT DOCUMENTS

| 5,756,217 A | 5/1998 | Schroder et al. |
| 2005/0158171 A1 | 7/2005 | Carper et al. |

(Continued)

FOREIGN PATENT DOCUMENTS

| EP | 0674020 A1 | 9/1995 |
| EP | 2017366 A1 | 1/2009 |
| WO | 2015041787 A1 | 3/2015 |

OTHER PUBLICATIONS

Wilson et al, "Thermally Sprayed abradable coating technology for sealing in gas turbines" in Oerlikon Metco, White Paper: Thermally Sprayed Abradable Coatings 2012.10, 2014 (no month) (pp. 1-9). (Year: 2014).*

(Continued)

*Primary Examiner* — Michael E. La Villa
(74) *Attorney, Agent, or Firm* — Polson Intellectual Property Law, PC; Margaret Polson; Christopher Sylvain

(57) ABSTRACT

The present invention discloses a turbine engine with at least a high pressure and a low pressure turbine section comprising a casing and at least one turbine blade rotatably mounted within the casing wherein at least part of the inner surface of the casing is covered with shrouds as abradables to provide clearance control between the inner surface and the tip of the at least one blade and wherein the tip of the blade is coated with a hard PVD coating, characterized in that the shroud (Continued)

material of at least the high pressure and/or the low pressure section comprises a porous ceramic based material and the hard PVD coating on the tip of the blade essentially consists of a droplet free nitride coating.

18 Claims, 3 Drawing Sheets

(51) Int. Cl.
| | |
|---|---|
| *C23C 14/06* | (2006.01) |
| *C23C 14/34* | (2006.01) |
| *C23C 14/35* | (2006.01) |
| *F01D 5/20* | (2006.01) |
| *C23C 30/00* | (2006.01) |
| *C23C 14/08* | (2006.01) |
| *F01D 11/08* | (2006.01) |
| *C23C 14/04* | (2006.01) |
| *C23C 14/12* | (2006.01) |
| *F01D 5/22* | (2006.01) |

(52) U.S. Cl.
CPC ...... *C23C 14/0641* (2013.01); *C23C 14/0676* (2013.01); *C23C 14/0688* (2013.01); *C23C 14/083* (2013.01); *C23C 14/12* (2013.01); *C23C 14/3485* (2013.01); *C23C 14/35* (2013.01); *C23C 30/00* (2013.01); *C23C 30/005* (2013.01); *F01D 5/20* (2013.01); *F01D 5/22* (2013.01); *F01D 5/225* (2013.01); *F01D 5/28* (2013.01); *F01D 5/286* (2013.01); *F01D 5/288* (2013.01); *F01D 11/08* (2013.01); *F01D 11/12* (2013.01); *F05D 2230/313* (2013.01); *F05D 2230/90* (2013.01); *F05D 2240/14* (2013.01); *F05D 2240/307* (2013.01); *F05D 2300/228* (2013.01); *F05D 2300/2281* (2013.01); *F05D 2300/2282* (2013.01); *F05D 2300/2284* (2013.01); *F05D 2300/506* (2013.01); *F05D 2300/611* (2013.01); *Y02T 50/60* (2013.01); *Y10T 428/12569* (2015.01); *Y10T 428/12576* (2015.01); *Y10T 428/12597* (2015.01); *Y10T 428/12611* (2015.01); *Y10T 428/12618* (2015.01); *Y10T 428/2495* (2015.01); *Y10T 428/24959* (2015.01); *Y10T 428/24967* (2015.01); *Y10T 428/24983* (2015.01); *Y10T 428/264* (2015.01); *Y10T 428/265* (2015.01)

(58) Field of Classification Search
CPC ... F01D 5/225; F01D 5/22; F01D 5/20; C23C 14/0641; C23C 14/3485; C23C 14/35; C23C 14/06; C23C 14/04; C23C 14/083; C23C 14/12; C23C 14/0676; C23C 14/0688; C23C 30/00; C23C 30/005; F05D 2230/313; F05D 2230/90; F05D 2240/307; F05D 2240/14; F05D 2240/23; F05D 2240/228; F05D 2240/2281; F05D 2240/2282; F05D 2240/2284; F05D 2240/506; F05D 2240/611; Y02T 50/60; Y10T 428/12576; Y10T 428/12597; Y10T 428/12611; Y10T 428/12618; Y10T 428/12569; Y10T 428/2495; Y10T 428/24967; Y10T 428/24959; Y10T 428/24983; Y10T 428/264; Y10T 428/265

See application file for complete search history.

(56) References Cited

U.S. PATENT DOCUMENTS

| | | |
|---|---|---|
| 2015/0075327 A1 | 3/2015 | Werner et al. |
| 2015/0368786 A1 | 12/2015 | Tryon et al. |

OTHER PUBLICATIONS

T. Kumar, "Comparison of TiAlN, AlCrN, and AlCrN/TiAlN coatings for cutting-tool applications," Int. J. Min., Metallurgy, and Mat., vol. 21, No. 8, Aug. 2014, (pp. 1-10). (Year: 2014).*

"Progress Report on China Nuclear Science and Technology. vol. 2: Proceedings of the 2011 Annual Meeting of the Chinese Society for Nuclear Science. Section 6, nuclear physics sub-volumes, computational physics sub-volumes, particle accelerator sub-volume", Chinese Nuclear Society, China Atomic Energy Press, 1st Edition, Oct. 2012, Beijing, ISBN: 978-7-5022-5610-4.

Office Action dated Aug. 7, 2020 in related Chinese application 201680077542.6.

Written Opinion of the International Searching Authority dated May 18, 2017 in parent international application PCT/EP2016/001854.

International Search Report dated May 18, 2017 in parent international application PCT/EP2016/001854.

R. Rajendran: "Gas turbine coatings—An overview", Engineering Failure Analysis, vol. 26, Aug. 31, 2012 (Aug. 31, 2012 ), pp. 355-369, XP0551 09145, ISSN: 1350-6307, DOI: 10.1 016/j.engfailanal.2012.07.007.

Wei R et al: "Erosion resistance of thick nitride and carbonitride coatings deposited using plasma enhanced magnetron sputtering", Plasma Processes and Polymers, Wiley-VCH Verlag, DE, vol. 4, No. S1, May 24, 2007 (May 24, 2007), pp. S693-S699, XP002570666, ISSN: 1612-8850, DOI: 10.1002/PPAP.200731707 [retrieved on May 24, 2007].

Goldbaum Dina et al: "Tribological behavior of TiN and Ti (Si.C)N coatings on cold sprayed Ti substrates". Surface and Coatings Technology. Elsevier BV. Amsterdam. NL. vol. 291. Feb. 21, 2016 (Feb. 21, 2016), pp. 264-275. XP029493090. ISSN: 0257-8972. DOI: 10.1016/J.SURFCOAT.2016.02.044. Sections 1-2; table 1.

Office Action dated Oct. 11, 2019 in related Chinese application 201680077542.6.

Johnston, R.E., "Mechanical characterisation of AlSi-hBN, NiCrAl-Bentonite, and NiCrAl-Bentonite-hBN freestanding abradable coatings", Surface & Coatings Technology, vol. 205, pp. 3268-3273 (2011).

* cited by examiner

| #       | R max [micron] | Rz [micron] | Ra [micron] |
|---------|----------------|-------------|-------------|
| 1       | 65.4           | 58.5        | 9.7         |
| 2       | 73.1           | 61.2        | 10.5        |
| 3       | 76.4           | 62.0        | 10.9        |
| Average | 71.6           | 60.4        | 10.4        |

FIG. 3

| #       | R max [micron] | Rz [micron] | Ra [micron] |
|---------|----------------|-------------|-------------|
| 1       | 91.9           | 84          | 13.8        |
| 2       | 93.9           | 79.4        | 12.9        |
| 3       | 92.3           | 77.6        | 13.1        |
| Average | 92.7           | 80.3        | 13.3        |

FIG. 4

TURBINE CLEARANCE CONTROL COATINGS AND METHOD

The present invention relates to blades for gas turbine engines as well as the gas turbine engines. According to the first embodiment of the present invention the disclosed blades comprise a physically vapor deposited (PVD) thin film hard coating for cutting and shaping clearance control coatings for turbine seal applications. This coating results in improved wear resistance of the blades which come into contact with thermally sprayed CoNiCrAlY-boron nitride, NiCrAl bentonite and NiCrAl-boron nitride clearance control coatings during rub incursion.

STATE OF THE ART

Typically turbine engines incorporate shaft-mounted turbine blades circumferentially circumscribed by a turbine casing or housing. In general the turbine casing proximal to the tips of the blades is lined with a plurality of abradable shroud materials (coatings) for example constructed of metallic/ceramic materials that have high thermal and erosion resistance. In many cases the abradable surface material itself is to a certain extend abrasive. Therefore a blade tip gap G is maintained to avoid contact between the two opposing components that might cause premature blade tip wear.

A principle setup is shown in FIG. 1, showing a turbine casing 1, a rotor disc 3 with a blade 5 comprising a blade root 7 and a blade tip 9. Shown as well is the abradable seal 11 and the tip gap G between abradable seal 11 and blade tip 9.

In order to minimize the blade tip gas flow leakage between the high pressure blade side and the low pressure blade side the blade tip gap G is to be chosen as small as practically possible.

In order to realize such systems with very small blade tip gap G it is known in the art to use so called squealer tips. WO2015/041787 discloses such blades with squealer tips. For running in purposes, when used the first time, these tips come into contact with the abradable coating of the casing or housing and thereby realize the minimized gap G. In order to form such squealer tips WO2015/041787 discloses a special geometry which is chosen to allow the tip of the turbine blade to act like a cutting tool, cutting into the abradable substrate and thereby shaping it. Unfortunately the problem of wear damage still exists as these tips with special geometries tend to experience wear when in contact with the abradable substrates often at specific combinations of blade tip velocity and incursion rate of the blade tip into the abradable shroud material. This is especially true if special abradable materials are used such as for example thermally sprayed CoNiCrAlY-boron nitride, NiCrAl bentonite and NiCrAl-boron nitride.

Another, very akin approach, is disclosed in U.S. Pat. No. 5,756,217A where a patterned strip coating is used as abrasive coating against an abradable coating, aiming for the same goal as above. The utilized coating materials are selected from the group of zirconium-, yttrium- and/or aluminium-oxides and the material is applied via thermal spraying through a perforated mask, which has been attached on the structural surface to be coated. Though U.S. Pat. No. 5,756,217A mentions that this procedure would avoid post-deposition profiling or machining, the handling effort of the proposed process is considerable and the wear damage against the above mentioned abradable materials remains as significant problem.

In US20150075327A1 Linska et al disclose wear resistant coatings on the blade tips produced by electrodeposition. These electrodeposited coatings seem to strengthen the tips of the blades and therefore work effectively, however require additional manufacturing steps. Another disadvantage of electrodepositing wear protection layers is the fact that only electrically conducting material can be deposited by electroplating. This restricts such coatings to relatively thick (e.g. 300-500 micron) metallic or alloyed layers, which in many cases are not wear resistant enough.

In US20150368786A1 a method for coating the tip of an airfoil is disclosed, which uses a mechanical mask to expose solely the tip region of the airfoil to the PVD coating. The disclosed thicknesses of the stellite, carbide or nitride coatings is mentioned between 25.4 to 127 µm, which should ensure the desired thickness tolerances of the airfoil towards the abradable. As the most preferable and only example of a wear coating cubic boron nitride is disclosed, as the material which does not wear down during operation and protects the structural integrity of the airfoil. The use of cubic boron nitride can be expected due to its generally known extraordinary high hardness, abrasion resistance and oxidation resistance up to ~1300° C. The deposition on technical substrates can however be quite challenging due to mostly observed presence of hexagonal boron nitride. Also the high stresses of PVD coatings in general, arising during growth, can limit the required coating thickness considerably and make most PVD coated carbides or nitrides unemployable for the application as wear resistant layer on airfoils.

There is therefore a need in the art for blades with blade tips which show wear resistance with respect to contact with abradable substrates as described above.

Objective of the Present Invention

According to the present invention the blade tips are coated with a physically vapor deposited thin film coating as for example know for cutting tools applications.

It is already known to use PVD coatings on turbine blades against corrosion as well as erosion by solid particles entrained into the compressor of the gas turbine engine. For example EP0674020B1 describes a multiple layer erosion resistant coating against such erosion by particles.

According to the present invention however PVD coatings are used to reinforce the tip of the blades against wear resulting from the interaction with the abradable substrates. There is severe wear damage arising from excessive friction heating of blade materials under severe rub incursion conditions in a turbine and/or if the abradable coating is thermal sprayed to too high bulk hardness condition. Mechanisms observed are blade material heating with softening, extreme bulk plastic deformation and fracture and transfer of blade material to the stator shroud. Combustion of blade material (mostly confined to titanium alloys) can also arise with severe engine damage arising as a result. Cracking of blade material happens due to extreme blade cutting forces arising from inefficient cutting against abradable shrouds with higher than specified hardness.

The focus of the present disclosure is on measures against two body abrasive wear of above-mentioned blade materials by one or more metal alloy or metal alloy oxide material components in the designated CoNiCrAlY-hBN, NiCrAl-bentonite, NiCrFeAl-hBN and NiCrAl-hBN abradable coatings, whereby hBN is used as abbreviation for hexagonal boron nitride.

Incursion rub events between blades on the rotor against stators (shrouds) can arise from a number of causes such as for example:
- different thermal expansion effects between rotor and stator components
- rapid changes in engine condition or loading such as a hard aircraft landing or surge
- "over temperature" running conditions
- rapid engine shutdowns
- distortion related factors due to casing out-of-roundness
- clearances in bearings and rotor vibrations arising from instabilities Under specific rotor incursion conditions of blade tip velocity and rate of incursion of the blade into the stator (shroud) wear damage of the blade tips can arise. In addition, if a clearance (abradable) coating is sprayed to a hardness or density above that of its specified hardness, increased blade wear damage can arise over a wide range of incursion conditions that would otherwise not occur.

It is to be noted that the kind of wear as a result of the events as described above is very different to the erosion impact damage which arises when particles such as for example sand or dirt are entrained within the gas flow and enter the turbine, hitting the blades.

An objective of the invention is therefore the elimination of wear damage resulting from the events as described above on for example:
- titanium alloy compressor blades
- nickel alloy compressor blades
- stainless steel compressor blades

BRIEF DESCRIPTION OF THE DRAWINGS

FIG. 3 is a table showing M2460NS shroud roughness after incursion vs. inventive PVD tipped Blade.

FIG. 4 is a table showing M2460NS shroud roughness after incursion vs. cBN tipped Blade according to state of the art.

DETAILED DESCRIPTION

Figure 1:
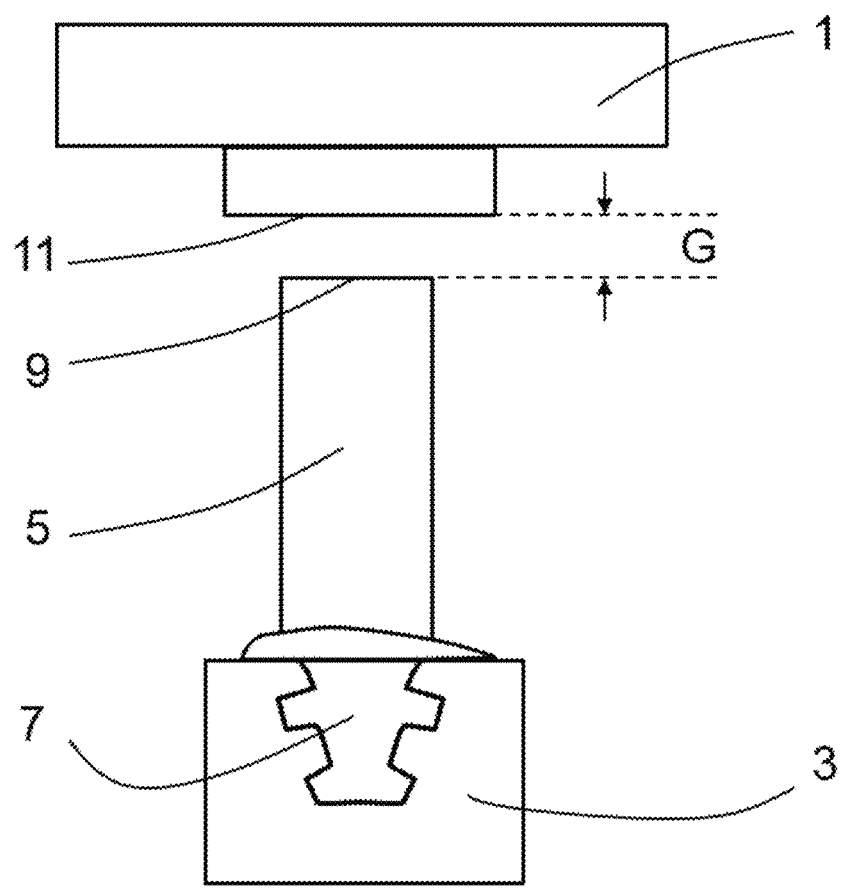
FIG. 1 is a schematic representation of an industrial or aerospace turbine, comprising at least one blade 5 on a rotor disc 3, with a blade root 7 and a blade tip 9, as well as an abradable seal 11, which is positioned inside the turbine casing 1 on the opposite side of the blade tip 9 and separated by a gap G.

According to the present invention this is achieved by the application of thin film physically vapor deposited (PVD) hard coatings on the blade surfaces that come into contact with abradable clearance control coatings as for example (CoNiCrAlY-hBN, NiCrAl-bentonite, NiCrAl-hBN, NiCrFeAl-hBN) during incursion rub events in the compressor section of a turbine engine.

In other words, according to the present invention the PVD hard coatings applied to the blades and in particular to the blade tips do have the purpose to protect against the wear resulting from interaction of the blade tips with the abradable substrate.

Surprisingly PVD coatings which are known from cutting tool applications may be advantageously used in this context and show excellent protection performance, in particular if coated on titanium alloy, stainless steel and/or nickel alloy blades which are used on low and high pressure compressor rotors and blisks in aero engines, and industrial gas turbine compressor rotors.

In the following throughout this disclosure the expression "tipping" is used when referring to provide a coating at least on the tip and preferably as well in the periphery of the tip of the blade. In order to define the word "periphery" it is assumed that a point on the surface of the blade shall according to the present invention be considered as part of the periphery of the tip of the blade if this point is no more than 100 times the coating thickness distant from the outermost part of the mounted blade (seen from the rotation axis).

Up to now, it is not known in the art to apply PVD coatings on blade tips for tipping purposes. Blades are commonly used without any form of tipping as (with respect to production) the most economical solution.

In cases however where tipping is used, the known technology is limited in general to thicker hard coatings such as those deposited by thermal spray techniques such as Atmospheric Plasma Spray (APS) and High Velocity Oxygen Fuel (HVOF) thermal spray. Coatings applied by these techniques are in general 100 to 200 micrometers thick and suffer disadvantages such as:
- insufficient adhesion to blade tip material; APS and HVOF coatings are mechanically bonded to the surface to be coated.
- coating dimensions (thickness) and weight are too large, especially for thin blade tips used in high pressure aero compressors.
- preparation of material to be coated requires surface roughening e.g. by grit blasting, which can damage the mechanical integrity of blade components.

In contrast, coatings deposited on the tips by PVD techniques are mostly metallurgically bonded to the substrate material and have very high adhesion strengths, require no surface pre-preparation techniques that could adversely damage the blade materials, are exceptionally hard, oxidation resistant. According the present invention, tip coatings deposited by PVD can be applied as very thin layers to blade tips e.g. 1-40 microns, preferably 5-25 microns thick, with the advantage of controlled intrinsic coating stresses and moderate surface roughnesses, while at the same time the PVD coatings exhibit a high density and wear resistance.

Tipping the blades with PVD coatings according to the present invention means for example applying to the tip of a blade and/or the periphery of the tip a thin (e.g. 1-40 micron thick) hard (e.g. 1000-3500 HV intrinsic coating hardness) PVD coating such as for example titanium nitride (TiN), titanium aluminium nitride (TiAlN), titanium silicon nitride (TiSiN), titanium carbon nitride (TiCN), chromium nitride (CrN) or aluminium chromium nitride (AlCrN), or combinations of these. These are hard coatings which are typically used in the context of cutting tools.

It was quite surprising when the inventors found that with these PVD coatings and in particular with the hard thin film PVD coatings as typically used in the field of cutting tools blade wear damage can be decreased and/or eliminated under a wide range of blade incursion conditions into the shroud. It was further surprising that the mentioned nitride based coatings do not suffer from premature oxidation, although it is known that these nitride based coatings have a significantly lower oxidation resistance at high temperatures than e.g. oxides or cubic boron nitride, as explained above.

It is not fully clear why this is works, however one possible explanation could be that the conditions present in the blade-tip and abradable surface interaction are approximately similar to the conditions when a high speed cutting tool is working on a metal alloy workpiece.

The invention will now be described in detail and with the help of examples.

The inventors based their studies on a broad range of abradable materials. Although these are as well coated (for example on the housing) the build up of these materials will be named coated shrouds in order to clearly distinguish them from the PVD coatings.

The tests have been based on the following shroud coating materials:

1. Ni 4Cr 4Al 21 Bentonite

Product names: Durabrade 2313, Metco 314NS, Metco 312NS, Durabrade 2311

These are cermet powders consisting of a nickel chromium aluminum alloy fully encapsulating the stabilized bentonite core. Encapsulation is achieved using a chemical cladding process. This provides a robust, high quality, binder-free composite powder. The powders were designed to produce substrates with varied erosion resistance and abradability to suit the end application. Substrates are designed to rub against nickel-based alloys or steel hardware.

2. CoNiCrAlY-hBN-Polyester

The CoNiCrAlY (cobalt-nickel-chromium-aluminum-yttrium) matrix within substrates of these materials provides improved oxidation and corrosion resistance compared to other nickel-chromium-based abradable materials. The boron nitride component provides solid lubrication, thereby improving abradability and reducing blade wear during rub incursions. The substrate porosity can vary from 35 to 60 vol. %; which is controlled through the amount of entrapped polyester in the coating. It is this controlled, web-like metallic structure that allows for excellent friability against titanium alloy, steel or superalloy components.

These substrates can be used at service temperatures up to 750° C. (1380° F.); however, an increased susceptibility to oxidation can be expected above 650° C. (1200° F.). For use under extreme environmental conditions or when hard, erosion resistant coatings are required, hard tipped mating blades or knife edges are recommended. Coatings of Metco 2042 and Metco 2043 are readily cut by bare, untipped nickel alloys and stainless steel components at service temperatures up to 650° C. (1200° F.). For use against bare, untreated titanium components, Metco 2042 is recommended at service temperatures up to 550° C. (1020° F.).

3. NiCrFeAl-hBN

Product names: Metco 301C-NS and Metco 301 NS i.e. Ni13Cr8Fe6.5BN3.5Al 2.

Nickel chromium alloy/boron nitride thermal spray powders are cermet composites, consisting of a nickel-chrome alloy, hexagonal boron nitride, and aluminum, and are manufactured using mechanical cladding techniques. The powders were designed to produce substrates with varied erosion resistance and abradability to suit the end application. Powders are best applied using the combustion powder spray process using either hydrogen or acetylene as the fuel gas.

4. Aluminium Bronze Polyester

Product names: Metco 604NS, Metco 605NS, Metco 610NS

Metco 604NS, Metco 605NS and Metco 610NS are powder materials designed to produce abradable substrates for aerospace and industrial turbine clearance control applications operating in marine environments where corrosion from salt is a concern. The metal matrix of these powders is a pre-alloyed aluminum bronze material. A specially formulated polyester material is combined with the aluminum bronze matrix material to form a low-density substrate structure. In the case of Metco 604NS and 605NS, the polyester is blended with the metallic constituent. Metco 610NS is a composite material where the polyester constituent is cladded to the metallic constituent using a solid organic binder.

With respect to NiCrAl-hBN-Polyester one can refer to the substrates as described in US patent application: WO 2011/094222 A1 (Dorfman, Wilson et. al).

In order to demonstrate the technical effect of the invention, an evaluation program was performed in the frame of which the performance of TiAlN coatings deposited on blade tips using a Physical Vapor Deposition (PVD) process at Oerlikon Balzers was tested. Accordingly TiAl6V4 and Inconel 718 blades were TiAlN-tipped and incursion tested against specific Oerlikon Metco abradable substrates.

TiAlN-tipped TiAl6V4 alloy blades were rub tested at 450° C. against:
1) M2042 abradable substrates: standard and high hardness levels HR15Y 39 and 69 respectively, as well as
2) M314NS abradable substrates: standard hardness level HR15Y 50

In addition TiAlN tipped IN718 alloy blades were rub tested at 750° C. against:
1) M2043 abradable hardness HR15Y 67
2) M314 abradable hardness HR15Y 50

All abradable substrates were thermally sprayed at Oerlikon Metco location in Switzerland (OM-CH).

A series of 16 incursion tests was performed on the Oerlikon Metco (OM) incursion test facility.

The tests were conducted at velocities of 250 and 410 m/s while the incursion rates tested were either 5 or 500 µm/s. The incursion depth to be reached was 1.0 mm.

Under the given tests conditions where bare titanium alloy blades normally undergo significant wear against Metco 2042 and Metco 2043 abradables (mostly at low blade tip velocity and high incursion rate). In contrast TiAlN tipping was found to produce improved rubbing performance with the result that no blade wear was observed i.e. 0% blade wear, which is measured as a percentage of the total incursion depth of the blade tip into the abradable coating shroud, nominally 1.0 mm. Some slightly negative blade wear values e.g. −1.0% were obtained which indicates slight transfer of shroud material to the blade tip, with no observed damage to the blade tip or tip coating.

Metco 314NS also exhibited blade wear when rubbed using bare TiAl6V4 blades without tipping. However after tipping these blades with TiAlN the incursion tests showed improved rubbing performance with no blade wear.

The program clearly showed that application of thin hard PVD coatings to tips of blades such as for example titanium alloy and nickel alloy blades tip a dramatic reduction in blade tip wear damage can be observed, showing improvement in cutting performance of specific abradable (clearance control) substrate materials sprayed to hardness values of up to at least 70HR15Y (post polymer burn out heat treated state).

The second embodiment of the present invention relates to abradable coatings used for high pressure compressor clearance control applications such as for example air turbines, industrial gas turbines and turbochargers.

Blade materials concerned are for example titanium alloys, stainless steel alloys and nickel based superalloys.

State of the art abradable materials for these applications are commonly metallic alloy based with low thermal stability as they show low oxidation and/or sintering resistance. They are manufactured on purpose in a softer and more porous condition in order to mitigate against blade damage, where blades in most cases have no protective tipping. This results in abradables with low bulk hardness. The porous nature of the abradable coatings make them particularly susceptible to high temperature oxidation due to the larger exposed surface area of metal alloy. In addition, the required higher porosity weakens the coating tensile strength and lowers its erosion resistance.

Especially if high temperature applications are in the focus, it is a disadvantage that those materials are in general not temperature resistant.

According to state of the art there are thermally stable zirconia-based polyester ceramic thermal spray powders which are commonly used as a high temperature abradable coating for clearance control applications in the turbine section of aerospace and industrial gas turbine engines and where the blade alloys are commonly manufactured from nickel based superalloys. In addition, porous and temperature resistant nickel and cobalt alloy based coatings are also employed in the high pressure compressor region of aerospace and industrial gas turbine engines where blade alloys are manufactured from either titanium alloys, stainless steels or nickel based superalloys. However for most of the higher temperature sealing applications the respective blade tips have to be covered with cubic boron nitride abrasive particles which are applied using established electroplating and high temperature brazing techniques as bare titanium alloys as stainless steel alloys or nickel alloys show too much wear against these hard ceramic abradables. In addition and especially if titanium alloys are used there is the potential of a titanium fire if abraded against high hardness abradable coatings.

The first embodiment above discloses hard thin film coatings applied to blade tips in order to protect against wear induced by abradables. Surprisingly the inventors in addition found that when bare blade tips are coated with hard, wear resistant thin film coatings, then even high temperature resistant shroud materials such as thermally sprayed porous zirconia oxide or other porous lower density ceramics such as magnesium aluminates (magnesium spinels) can be used as shroud materials without damaging the blade tips. This now therefore enables the use of thermally stable (high melting point, high oxidation resistant) ceramic or intermetallic based clearance control materials specifically in both low and high pressure compressor regions of aero turbines, industrial gas turbines and turbochargers.

Current state of the art for high pressure compressor clearance control (abradable) applications are abradable coatings which are:
  lower in bulk hardness (softer) than ceramic abradables,
  more porous than ceramic abradables.
  commonly metallic alloy based with lower thermal stability (oxidation and sintering resistance) than ceramics They need to be manufactured in a softer and more porous condition in order to mitigate against blade damage, where blades in most cases have no protective tipping. On the other hand it is known to coat the tips of blades in order to eliminate blade damage (wear). Use of PVD thin film coatings such as TiAlN and AlCrN deposited on the tips of blades is used in turbomachinery.

Where examples of blade materials are:
  titanium alloys e.g. TiAl6V4, Ti6242, gamma TiAl type (Ti-45Al-8Nb)
  stainless steel alloys e.g. 17-4 PH steel
  nickel based superalloys e.g. Inconel 718.

The inventors now found that the thin film hard coatings are so efficient in their wear protection effect that harder abradable shroud materials with higher thermal stability (high melting point/sintering resistance, high oxidation resistance) such as thermally sprayed porous zirconia oxide coatings e.g. Metco 2460 (M2460) can be used with advantage.

TiAlN coatings were deposited on blade tips (Inconel 718) using a Physical Vapor Deposition (PVD) process. Incursion tested against two different sets of Metco 2460NS abradable coatings were thermally sprayed.

Two incursion tests were performed on an incursion test facility. A first test was run rubbing a TiAlN blade tip coating against a hard version of plasma sprayed M2460NS coatings while a second test was run using another set of M2460NS coatings plasma sprayed using a standard spray parameter.

Both tests were conducted at:
blade tip velocity of 410 m/s
incursion rate of 50 µm/s.
Shroud temperature of 1100° C.
Incursion depths of 0.2 mm or 0.5 mm.

M2460NS is a zirconia-based polyester ceramic thermal spray powder which, as mentioned above is commonly used as a high temperature abradable coating for clearance control applications in the turbine section of aerospace and industrial gas turbine engines where according to prior art cubic boron nitride is used a blade material.

The following two variants of this coating were manufactured by thermal spraying and heat treated to burn out the polyester porosity former.

High hardness M2460NS: Macro hardness was measured at an average of 59HR15N (polymer burned out condition). This M2460NS abradable coating sample was tested after polymer burnout (550° C./6 h) The test run using a blade tip velocity of 410 m/s and an incursion rate of 50 µm/s exhibited good rubbing performance associated with no blade wear.

Standard hardness M2460NS coating: Macro hardness was measured at an average of 36HR15N (polymer burned out condition). This M2460NS abradable coating sample was tested after polymer burnout (550° C./6 h). The test run using a blade tip velocity of 410 m/s and an incursion rate of 50 µm/s exhibited good rubbing performance associated with no blade wear and superficial blade height increase (2.1% blade height increase as a percentage of incursion depth).

Typical blade wear seen for un-tipped (uncoated) Inconel 718 blades when incursion tested against M2460 shrouds ranges between 70-100% wear as a percentage of total incursion depth. Typically zero blade wear is seen for state of the art cubic boron nitride tipped Inconel 718 blades when incursion tested against M2460 shrouds.

Surprisingly the ranges seen for the TiAlN coated blade tips are similar to those as seen from state of the art cubic boron nitride tipped blades i.e. zero blade wear as a percentage of total incursion depth.

Based on these results it is assumed that if the tips are coated with AlCrN the ranges are at least comparable if not better. Especially in the high temperature range AlCrN might be preferred. Probably this goes back to the increased temperature stability of this PVD coating.

Surface roughness measurements were made of the post incursion tested (cut) shroud surfaces and compared to those cut using a commercially available standard blade tip (abrasive cubic boron nitride). The results (given below in tables 1 and 2) indicated that the PVD tipped blade produced a smoother, lower roughness surface finish. Such improvements are critical for aerospace clearance control applications in all sections (compressor and turbine) of aero turbomachinery.

The table of FIG. 3 shows M2460NS shroud roughness after incursion vs. inventive PVD tipped Blade.

The table of FIG. 4 shows M2460NS shroud roughness after incursion vs. cBN tipped Blade according to state of the art.

Improvements observed through the use of TiAlN and/or AlCrN PVD coatings on blades:
  Reduction in blade wear to zero when compared to un-tipped blades where blade wear is typically high at 70-100% of total incursion depth.
  Equivalent blade wear (zero) to that observed for current state of the art cubic boron nitride tipped blades.
  Improved reduction in shroud surface roughness over that observed for current state of the art cubic boron nitride tipped blades.
  Lower cost, lower dimensions (coating thickness) and higher manufacturing robustness of PVD tipped blades over that observed for current state of the art cubic boron nitride tipped blades. In particular, the ease with which thinner blade tips, with complex tip geometries can be coated by PVD techniques provide a significant advantage over the state of the art.
  Due to the ease with which nickel super alloy and stainless steel blade materials can be shaped and coated using hard, thin film PVD coatings they now enable the use of porous ceramic based abradables for use in high pressure compressor section of turbomachinery, having significant performance advantages in:
    i) Oxidation resistance
    ii) Sintering resistance
    iii) Corrosion resistance
  over state of the art high pressure compressor abradables (metallic alloy based).
  Due to the ease with which other blade materials such as titanium alloys can be coated using hard, thin film PVD coatings, they now open up the opportunity for the use of porous ceramic based abradables for use in low pressure compressor section of turbomachinery, with significant advantages in:
    i) Corrosion resistance
    ii) Improved thermal expansion mismatch and residual stress compatibility over state of the art low pressure compressor abradables (commonly aluminium alloy based).

The combination of hard thin film coated blade tips and thermally stable porous ceramic shrouds as abradables was disclosed as advantageous as compared to prior art. Preferably the hard thin film coating comprises compound materials such as Me1 Me2X, where Me1 is preferably an element of the group formed by Ti, Cr or Zr or a combination thereof and Me2 is preferably Al and/or Si and X is preferably an element of the group formed by N, 0 or 8 or a combination thereof. The one skilled in the art knows a number of methods to efficiently apply such coatings on blade tips, among which the physical vapor deposition such as cathodic arc deposition or sputtering is preferred.

According to another aspect of the present invention a method for coating blades with hard thin film coatings is disclosed. This aspect not only relates to the tips of the blades and the protection of these tips against the abradable shrouds but as well to the protection of the blades against erosion particles such as for example dust impinging with high velocity and under multiple angles of incidence onto the surface of the blades. As already mentioned above, physical vapor deposition is one of the preferred methods to apply such thin film coatings onto the surface of the blades. Examples are cathodic arc evaporation as well as sputtering. Typically cathodic arc evaporation provides very dense and hard layers which is of advantage in the applications the present invention is concerned with. The density can be realized as the particles to be deposited are positively charged to a high degree. Applying a negative bias voltage to the substrates accelerates these ions to the surface to be coated. However the resulting coatings in general have a considerable surface roughness, due to the so called droplets which typically are produced during arc evaporation and which are deposited onto the surface and incorporated into the thin films. As already discussed above in the context of coating the tips, such roughness might be of disadvantage. Apart from this the surface roughness on the blade surface creates centers where erosion particles can attack and create centers of erosion which naturally weakens the protection against erosion. Surface roughness in addition disadvantageously affects the flow within the turbine in an accidental and difficult to control manner. There are techniques to mostly avoid the deposition and incorporation of such droplets into the thin film or on its surface during cathodic arc evaporation. For example one could use filtered arc where magnetic and/or electric fields are used to influence the flight of the charged particles to be deposited. As the droplets are not charged or as they are mainly macroscopic, to have to be considerably accelerated, the coating particles are separated from the droplets on their way to the substrates to be coated.

Sputtering is the other preferred method to apply a thin film to a substrate based on physical vapor deposition. In the context of sputtering ionized particles of a so called working gas are accelerated onto the surface of a sputtering target. When these ions are impinging into the target surface particles of the target material are catapulted out. Acceleration of the ionized working gas particles is based on a negative voltage applied to the target. As the bombardment of the target with these particles heats it up, the energy density with which the target can be run in general is limited. Sputtered thin films show less surface roughness as compared to thin films deposited by cathodic arc evaporation as no droplets are formed during deposition. However in general the sputtered particles are not charged or the degree of ionization is at least very low. Therefore these particles may not be accelerated in direction to the surface to be coated once they left the surface of the material providing target. The inventors of the present invention now found a way and had the idea to use a special PVD coating method for coating the blades, such method leading to high density thin films without incorporating any droplets into the films.

The respective method is based on sputtering, however the energy density, with which the sputtering process is run is dramatically increased as compared to conventional sputtering. Such an increase results in charged particles ejected from the target surface and therefore a negative bias can be applied to the substrates to be coated in order to accelerate the charged coating particles in direction to the substrate. Heating of the target can be avoided by periodically and with high frequency switching off the respective voltage at the target. This so called HIPIMS is, as mentioned a sputtering method but has the disadvantage that complicated power generators which provide well shaped and reproducible high power pulses in a high frequency are required. In the context of another sputtering method as developed by the applicant, the power is not switched off, but is just switched to a different target and/or a power dump. The applicant provides this method under the brand "53p". A detailed description of one example of implementing the respective sputtering method can be found in patent application WO2013/060415A1.

According to one aspect of the present invention it is possible to accelerate the coating particles to such a velocity that when they hit the surface they have a velocity which is in the same order of magnitude as the expected mean velocity of the dust particles to impinge onto the surface during use of the blade.

Preferably the hard thin film coating is produced by HIPIMS, especially preferred by S3p and comprises compound materials such as Me1Me2X, where Me1 is preferably an element of the group formed by Ti, Cr or Zr or a combination thereof and Me2 is preferably Al and/or Si and X is preferably an element of the group formed by N, O or B or a combination thereof.

All PVD coatings mentioned in the description above can be monolayer or multilayer coatings. They can be applied with an adhesion layer between turbine blade substrate, however preferably directly onto the substrate material itself. In case of multilayers interlayers for example metallic interlayers can be foreseen. It is as well possible to have one or more layers comprising a gradient in the material composition as a function of coating depth, preferred however are monolayers and especially preferred is an AlCrN monolayer.

It is as well possible to coat the blade body surface with another coating as compared to the blade tips. One could for example coat all exposed surface parts of the blades with a coating to be used for the blade tips, which preferably can be an AlCrN monolayer. After this it is possible to mask the tips and to coat the other surface parts in addition with some softer thin film material for the dust particles to impinge on the surface.

A turbine engine was disclosed with a turbine section comprising a casing and at least one turbine blade rotatably mounted within the casing wherein at least part of the inner surface of the casing is covered with shrouds as abradables to provide clearance control between the inner surface and the tip of the at least one blade and wherein the tip of the blade is coated with a hard PVD coating, characterized in that the shroud material at least comprises and preferably is a porous ceramic based material.

The PVD coating can be a coating comprising compound materials such as Me1Me2X, where Me1 is preferably an element of the group formed by Ti, Cr or Zr or a combination thereof and Me2 is preferably Al and/or Si and X is preferably an element of the group formed by N, O or B or a combination thereof.

The shroud material can at least comprise and preferably is a zirconia-based polyester ceramic material.

A method for manufacturing a turbine engine according to the turbine engines as described above was disclosed, the method comprising the steps of:
thermally spraying the shroud material to the inner surface of the casing
PVD coating at least the tip of the blade to be used within the casing The step of PVD coating can be performed by high power impulse magnetron sputtering with power density pulses equal or above 5 W/cm2 and preferably equal or below 50 W/cm2, more preferably equal or below 40 W/cm2 and most preferably equal or below 30 W/cm2.

The power can be provided by a DC power generator and the pulses are realized by switching the power form one material delivering sputtering target to another and/or to a dummy target.

Figure 2:
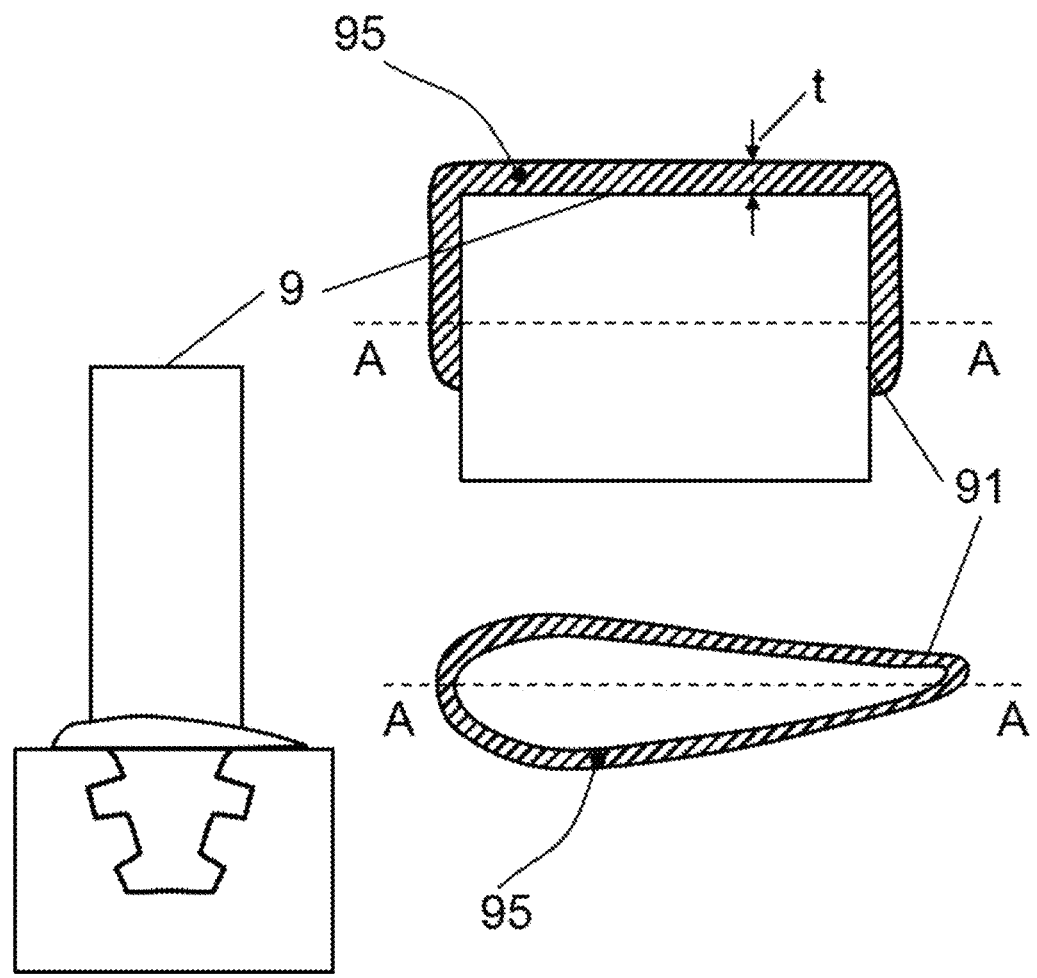
FIG. 2 is a schematically representing the homogenous coating thickness distribution on and around the coated blade tip region 9.

Surprisingly the PVD coating 95 produced by high power impulse magnetron sputtering further exhibits a uniform coating thickness distribution with a maximum deviation of about 10% from the mean coating thickness t, measured on the blade tip 9. The high uniformity of coating thickness and properties also applies along the coated corner between blade tip 9 and the mantle surface 91 of the turbine blade, as well as around the turbine blade, as indicated in FIG. 2. It turned out that the essentially droplet free coatings exhibit an extremely dense structure which reduce the possibility of coating failure during operation. This feature is assumed to be responsible for the high durability of the PVD coatings against the metallic or ceramic shroud materials, almost independent of their pore volume.

Several variants of the inventive PVD coatings, such as Ti50Al50N, Ti40Al60N, Ti33Al67N, as well as Al50Cr50N, Al60Cr40N and Al70Cr30N have been deposited and achieved a similarly good coating thickness distribution. The best performance results have been achieved if the PVD coating 95 exhibit Me2 contents of 40 to 70 at. %, when calculating from Me2/(Me1+Me2) in Me1Me2X, thereby taking only to the metallic constituents of the coating into account.

It was found that the inventive PVD coatings can be deposited as thin layers, e.g. 1-40 microns, preferably 5-25 microns thick.

The invention claimed is:

1. A turbine engine with a high-pressure and a low-pressure turbine section comprising:
a casing and at least one turbine blade rotatably mounted within the casing, wherein at least part of an inner surface of the casing is covered with an abradable shroud material to provide clearance control between the inner surface and a tip of the at least one turbine blade,
wherein the tip of the at least one turbine blade is coated with a hard PVD coating,
wherein the abradable shroud material of the high-pressure and/or the low-pressure turbine section comprises a porous material made of CoNiCrAlY-hBN, NiCrAl-bentonite, NiCrAl-hBN or NiCrFeAl-hBN, and
wherein the hard PVD coating on the tip of the at least one turbine blade consists of a droplet-free nitride PVD coating, the nitride PVD coating comprising Me1Me2X, where:
Me1 is an element of the group formed by Ti, Cr or Zr, or a combination thereof,
Me2 is Al and/or Si, and
X is an element of the group formed by N, or N and O, or N and B, or N and O and B.

2. The turbine engine of claim 1, wherein the droplet-free nitride PVD coating consists of compound materials Me1Me2X, where Me2 is between 40 to 70 at. % when calculating Me2/(Me1+Me2).

3. The turbine engine of claim 1, wherein the droplet-free nitride PVD coating has a coating thickness of 1 to 40 μm.

4. The turbine engine of claim 3, wherein the droplet-free nitride PVD coating has a coating thickness of 5 to 25 μm.

5. The turbine engine of claim 1, wherein the at least one blade consists of titanium alloy, stainless steel or nickel alloy.

6. The turbine engine of claim 1, wherein the nitride PVD coating is TiAlN or AlCrN.

7. The turbine engine of claim 1, wherein a blade body of the at least one turbine blade is coated with a coating that is different from the nitride PVD coating on the tip of the at least one turbine blade.

8. A method for manufacturing the turbine engine of claim 1, comprising the steps of:
- thermally spraying the abradable shroud material to the inner surface of the casing, wherein at least part of the inner surface of the casing is covered with the abradable shroud material to provide clearance control between the inner surface and the tip of the at least one turbine blade, and wherein the abradable shroud material is made of CoNiCrAlY-hBN, NiCrAl-bentonite, NiCrAl-hBN or NiCrFeAl-hBN; and
- PVD coating the tip of the at least one turbine blade to be used within the casing, wherein the hard PVD coating on the tip of the at least one turbine blade consists of a droplet-free nitride PVD coating, the nitride PVD coating comprising Me1Me2X, where:
- Me1 is an element of the group formed by Ti, Cr or Zr, or a combination thereof,
- Me2 is Al and/or Si, and
- X is an element of the group formed by N, or N and O, or N and B, or N and O and B.

9. The method of claim 8, comprising the additional steps of:
- masking the tip of the at least one turbine blade; and
- PVD coating of a blade body of the at least one turbine blade with a coating that is different from the nitride PVD coating of the tip of the at least one turbine blade.

10. The method of claim 9, wherein the PVD coating of the tip is performed by high-power impulse magnetron sputtering with power density pulses ≥5 W/cm2 and ≤50 W/cm2.

11. The method of claim 10, wherein the power density pulses are ≤40 W/cm2.

12. The method of claim 11, wherein the power density pulses are ≤30 W/cm2.

13. The method of claim 10, wherein power is provided by a DC power generator and the power density pulses are realized by switching the power from one material delivering sputtering target to another and/or to a dummy target.

14. The method of claim 8, wherein the PVD coating is performed by high-power impulse magnetron sputtering with power density pulses ≥5 W/cm2 and ≤50 W/cm2.

15. The method of claim 14, wherein the power density pulses are ≤40 W/cm2.

16. The method of claim 15, wherein the power density pulses are ≤30 W/cm2.

17. The method of claim 14, wherein power is provided by a DC power generator and the power density pulses are realized by switching the power from one material delivering sputtering target to another and/or to a dummy target.

18. A turbine engine with a high-pressure and a low-pressure turbine section comprising:
- a casing and at least one turbine blade rotatably mounted within the casing, wherein at least part of an inner surface of the casing is covered with an abradable shroud material to provide clearance control between the inner surface and a tip of the at least one turbine blade,
- wherein the tip of the at least one turbine blade is coated with a hard PVD coating,
- wherein the abradable shroud material of the high-pressure and/or the low-pressure turbine section is comprised of a zirconia-based polyester ceramic material, and
- wherein the hard PVD coating on the tip of the at least one turbine blade consists of a droplet-free nitride PVD coating, the nitride PVD coating comprising Me1Me2X, where:
- Me1 is an element of the group formed by Ti, Cr or Zr, or a combination thereof,
- Me2 is Al and/or Si, and
- X is an element of the group formed by N, or N and O, or N and B, or N and O and B.

\* \* \* \* \*